United States Patent
Fukasawa et al.

(10) Patent No.: US 7,434,977 B2
(45) Date of Patent: Oct. 14, 2008

(54) BACKLIGHT SYSTEM

(75) Inventors: Koichi Fukasawa, Kofu (JP); Junji Miyashita, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 126 days.

(21) Appl. No.: 11/319,191

(22) Filed: Dec. 28, 2005

(65) Prior Publication Data
US 2006/0146576 A1 Jul. 6, 2006

(30) Foreign Application Priority Data
Dec. 28, 2004 (JP) ............................. 2004-382176

(51) Int. Cl.
*F21V 7/04* (2006.01)
(52) U.S. Cl. .................... 362/631; 362/97; 362/633
(58) Field of Classification Search ............... 362/612, 362/97, 330, 294, 373, 613, 631, 633
See application file for complete search history.

(56) References Cited
U.S. PATENT DOCUMENTS

| 6,428,189 B1 * | 8/2002 | Hochstein | 362/373 |
| 7,121,692 B2 * | 10/2006 | Yu et al. | 362/330 |
| 7,152,988 B2 * | 12/2006 | Hung | 362/97 |
| 7,175,329 B1 * | 2/2007 | Chou | 362/612 |
| 7,192,176 B2 * | 3/2007 | Lo et al. | 362/612 |
| 7,204,604 B2 * | 4/2007 | Chou | 362/227 |
| 7,287,879 B2 * | 10/2007 | Hsu | 362/294 |
| 2006/0087866 A1 * | 4/2006 | Ng et al. | 362/612 |

FOREIGN PATENT DOCUMENTS
JP          64-49886         3/1989

* cited by examiner

*Primary Examiner*—Sandra O'Shea
*Assistant Examiner*—James W Cranson
(74) *Attorney, Agent, or Firm*—Browdy and Neimark, P.L.L.C.

(57) ABSTRACT

A backlight system including a printed board, a plurality of light sources mounted on a surface of the printed board, a frame member disposed to surround the plurality of light sources, a plurality of through-holes provided in the printed board to reduce weight of the printed board, and a cover member disposed on the printed board to cover the plurality of through-holes, whereby accomplishing great reduction in weight of the printed board without lowering reflection efficiency of light emitted from the light sources and providing a backlight system capable of effectively using for a large liquid crystal display.

6 Claims, 3 Drawing Sheets

BACKLIGHT SYSTEM

CROSS-REFERENCE TO THE RELATED APPLICATION

This application is based on and claims the priority benefit of Japanese Patent Application No. 2004-382176 filed on Dec. 28, 2004, the disclosure of which is incorporated herein by reference in its entirety.

BACKGROUND OF THE INVENTION

1. Field of the Invention

The present invention relates to a backlight system disposed in a back side of a liquid crystal display.

2. Description of Related Art

Recently, liquid crystal displays each including a backlight system have become widely used in various electronics items such as notebook computers in which optical communication devices are installed, personal digital assistants, mobile phones, liquid crystal televisions or the like.

It is known that this kind of backlight system includes a light-emitting source such as a fluorescent lamp or an LED, and a light diffusion plate configured to uniformly diffuse light emitted from the light-emitting source to illuminate the liquid crystal display. This kind of backlight system uniformly illuminates the liquid crystal display from a back side thereof, and has the advantageous effects that a person can look easily at the liquid crystal screen and also the backlight system itself can be thinned.

An LED is often used as the light-emitting source of the backlight system, and hence a miniaturized, thinned and long-lived backlight system can be achieved. If LEDs are used and it is desired to acquire white illumination light from the backlight system, three kinds of high-intensity LEDs, red (R), green (G) and blue (B) LEDs, are used, and these three kinds of LEDs are simultaneously lighted or lighted in a time sharing manner. The light from the three kind of LEDs is mixed and this mixed lights appears to be white light. White-light emitting LEDs comprising blue LEDs and fluorescent materials may be used instead of RGB LEDs. Each of the white-light emitting LEDs emits white light singularly.

In particular, if white-light emitting LEDs are used in a backlight system, a structure of the backlight system is simplified, and miniaturization of the backlight system is also accomplished.

FIG. 4 illustrates a conventional backlight system as disclosed in Japanese Utility Model Laid-Open No. S64-49886, for reference. The backlight system 1 includes an insulative printed board 2, a plurality of LEDs 3 disposed on an upper surface of the printed board 2, a reflective frame 4 disposed to surround the plurality of LEDs 3, and a light diffusion member 5 mounted on an upper end surface of the reflective frame 4 to face a light-emitting surface (upper surface) of each of the LEDs 3. The backlight system 1 is disposed close to a back surface of a liquid crystal display 7. Moreover, a white glossy film 6 is printed on a surface of the printed board 2 excepting the LEDs 3 and configured to reflect light emitted from the LEDs 3 upwardly.

With the backlight system 1 having the structure as mentioned above, most of the illumination light from the LEDs 3 enters the light diffusion member 5 and becomes scattered light which is emitted in the direction of the liquid crystal display 7. In this case, one portion of the illumination light is reflected by the light diffusion member 5 to be returned to the printed board 2, the returned light is reflected on the white glossy film 6 printed on the surface of the printed board 2 upwardly, and the light reflected by the film again enters the light diffusion member 5 and is thereafter emitted to the liquid crystal display 7.

However, in the backlight system 1 structured as mentioned above, if the backlight system is used for a large-size liquid crystal display, because a large-size printed board 2 must be used depending on the large-size screen of the liquid crystal display, there is a problem that the weight of the printed board 2 becomes excessive, resulting in a low practical value for the backlight system.

SUMMARY OF THE INVENTION

An object of the present invention is to provide a backlight system in which reduction in weight of a printed board is accomplished without lowering light reflection efficiency on a surface of the printed board.

To accomplish the above object, a backlight system according to one embodiment of the present invention includes a printed board, a plurality of light sources mounted on a surface of the printed board, a frame member disposed to surround the plurality of light sources, a plurality of through-holes provided in the printed board to reduce a weight of the printed board and a cover member disposed on the printed board to cover the plurality of through-holes.

DETAILED DESCRIPTION OF THE PREFERRED EMBODIMENTS

Preferred embodiments of the present invention will be explained below with reference to the accompanying drawings.

Figure 1:
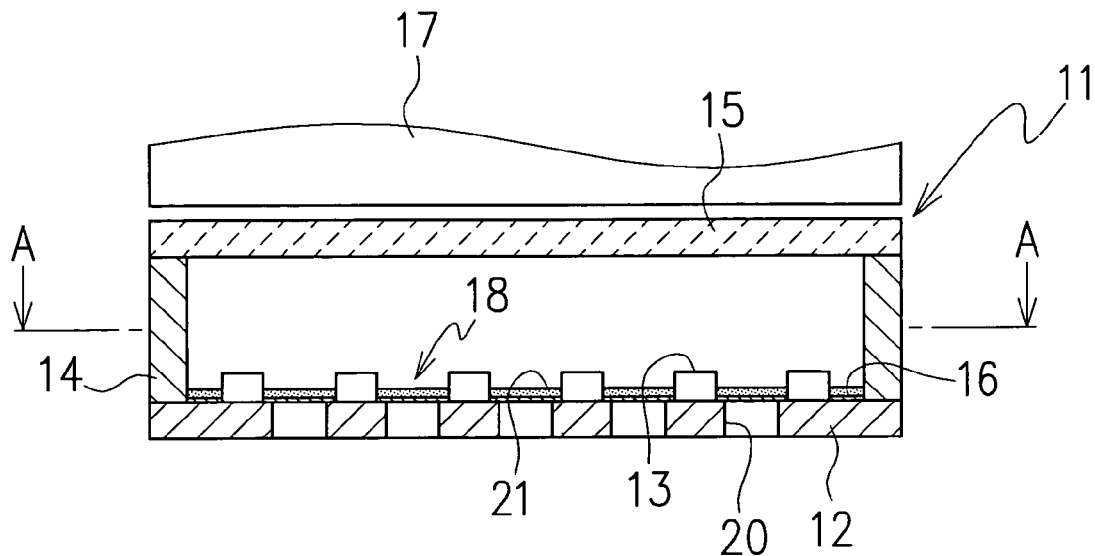
FIG. 1 is a sectional view showing a structure of a backlight system according to one embodiment of the present invention.
Figure 2A:
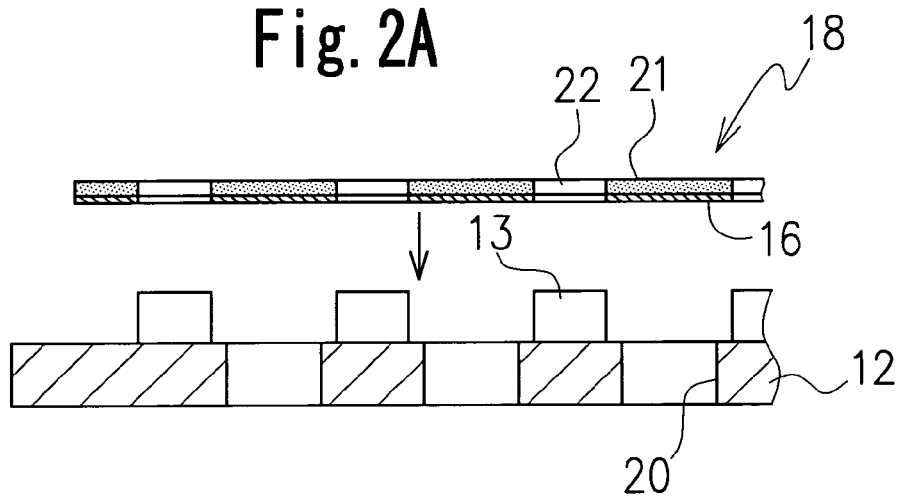
FIG. 2A is a partially enlarged sectional view showing a state before a reflective member is mounted on a printed board in the backlight system according to the embodiment shown in FIG. 1.
Figure 2B:
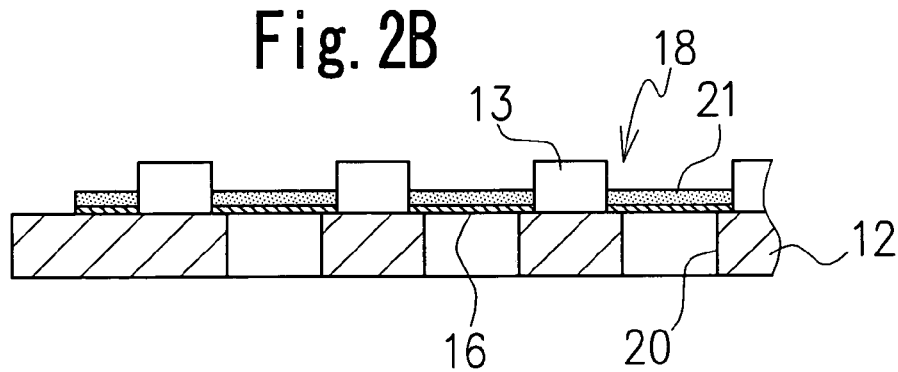
FIG. 2B is a partially enlarged sectional view showing a state after the reflective member is mounted on the printed board in the backlight system according to the embodiment shown in FIG. 1.
Figure 3:
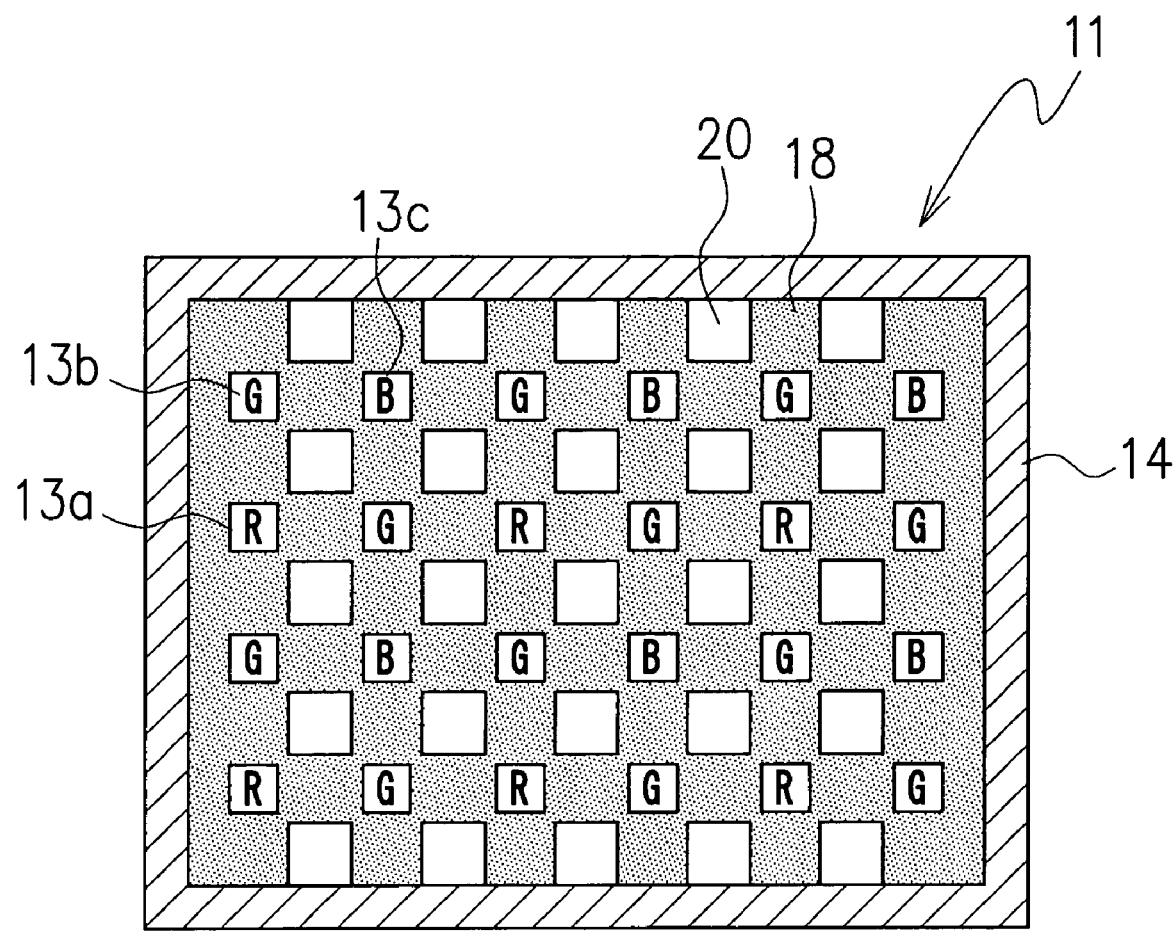
FIG. 3 is a sectional view taken along A-A line in FIG. 1.
Figure 4:
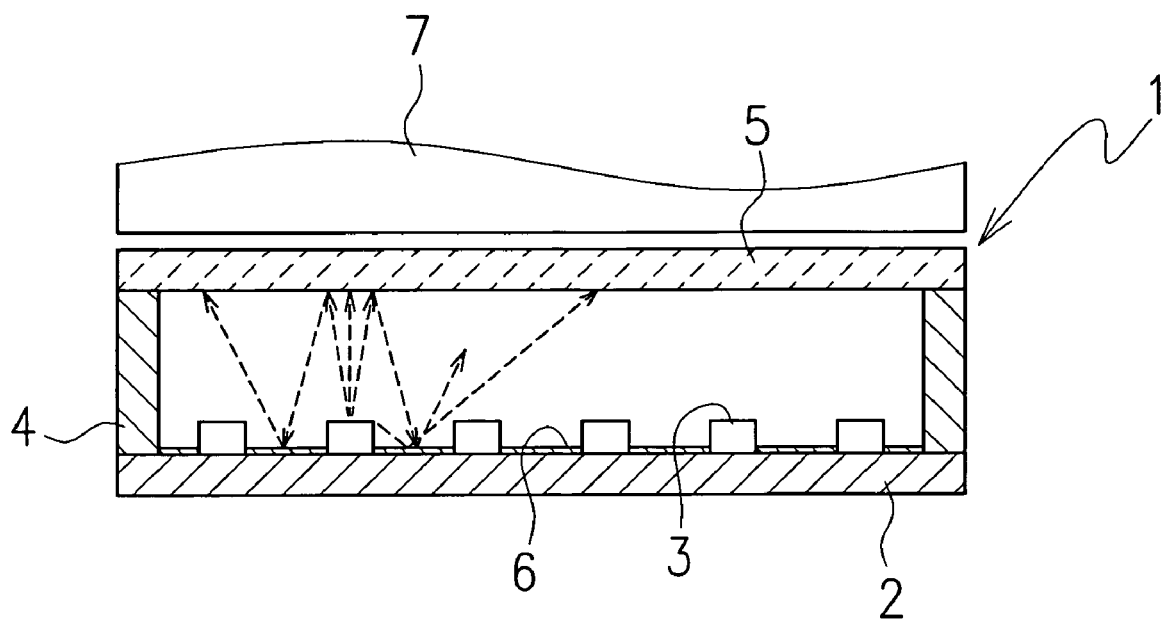
FIG. 4 is a sectional view showing a structure of a conventional backlight system.

A structure of a backlight system according to one embodiment of the present invention is shown in FIGS. 1 to 3. The backlight system 11 includes an insulative printed substrate 12 made of glass epoxy resin or the like and having wiring patterns (not shown) formed thereon, a plurality of light sources, for example, LEDs 13, disposed on a surface, for example, an upper surface of the printed board 12 and electrically connected to the wiring patterns, a frame member or reflective frame 14 to surround the plurality of LEDs 13, and a light diffusion member 15 disposed above of the light sources.

The light diffusion member 15 is mounted on an upper end surface of the reflective frame 14 to face an upper surface or light-emitting surface of each of the LEDs 13. The backlight system 11 is disposed adjacent to a back surface of a liquid crystal display 17 (see FIG. 1). Inner surfaces of the reflective frame 14 are preferably provided with suitable reflective surfaces for allowing light from the LEDs to be reflected towards the light diffusion member 15.

In this embodiment, three kinds of LEDs, red (R) LEDs 13*a*, green (G) LEDs 13*b*, and blue (B) LEDs 13*c*, are arranged, for example, in a grid pattern throughout the entire upper surface of the printed board 12 to uniformly illuminate the liquid crystal display 17 by white light, as shown in FIG. 3.

Meanwhile, a positional relationship, spaces, number and so on of the arranged LEDs 13*a*, 13*b* and 13*c* are suitably determined based on a size and other required conditions of the liquid crystal display 17. In addition, for example, a plurality of white light-emitting LEDs each singularly emitting white light may be arranged in a lengthwise and crosswise grid pattern of the printed board 12.

It should be noted that in this embodiment a plurality of through-holes 20 are provided all over the printed board 12 (see FIGS. 1 and 3). The through-holes 20 are arranged in a grid pattern between the LEDs, similar to the grid-shaped arrangement of the LEDs 13 in this embodiment.

In this way, by providing the plurality of through-holes in the printed board 12, a weight of the printed board 12 can be greatly reduced. This results in very high practical value when the backlight system 11 according to the present invention is used for a large liquid crystal display.

In the above, there is no limitation on the positions where the through-holes 20 are provided, or on the number of the through-holes 20; these are determined based on the position of each of the LEDs 13 disposed on the printed board 12, positions of wiring patterns electrically connected to the LEDs 13, strength of the printed board 12, and so on. Moreover, the shape of each of the through-holes 20 is not limited to the square shape shown in FIG. 3 but may also be formed by suitably selecting from, for example, a circular shape, elliptical shape, rectangular shape, or the like.

It should also be noted that in this embodiment a cover member 18 is mounted on the upper surface of the printed board 12 to cover the through-holes 20 (see FIGS. 1 and 2B). The cover member 18 may be dry film resist on which a reflection surface is formed, and the reflection surface may be formed by vapor deposition of aluminum, silver, or the like. Also, the cover member 18 may be a thin plastic film, and if the plastic film is made of white material, the plastic film itself works as a reflective surface. To increase reflectance, a reflection coating formed by aluminum or silver evaporation may be applied to the plastic film.

More specifically, as shown in FIG. 2A, a cover member 18 having a reflection surface 21 and a plurality of openings 22 disposed to correspond to the positions of the LEDs 13 is prepared.

Here, when the reflection surface 21 is formed on the film 16 to compose the cover member 18, a height of each of the LEDs and a thickness of the cover member 18 are preferably set so that the light-emitting surface of each of the LEDs 13 projects from the reflection surface 21. It is preferable that the reflection surface 21 has a mirror surface to enhance light reflectance. In this way, when the cover member 18 is mounted on the printed board 12 to cover the through-holes 20, the reflection surface 21 is disposed on the upper surface of the printed board 12 excepting the LEDs 13.

In addition, it is preferable that the film 16 has a strength sufficient to maintain flatness at upper edges of the through-holes 20. The film 16 may be a dry film resist or a thin plastic film.

In the above-mentioned embodiment, the LEDs 13 may be first mounted on the upper surface of the printed board 12, after which the cover member 18 is disposed to cover the through-holes 20. Also, another process is available. The cover member 18 may be first mounted on the printed board 12 and then, each of the LEDs 13 may be mounted on the printed board 12 in the positions exposed in each of the openings 22 of the cover member 18. The sequence of process is flexible, and the same effect can be achieved.

Instead of forming the reflection surface 21, a reflective film (not shown) may be mounted on the upper surface of the film 16.

A shape, size and so on of the reflective frame 14 surrounding the LEDs 13 are determined based on a shape of the printed board 12, a shape of the liquid crystal display 17, and so on. A material of the reflective frame 14 is not limited particularly, but it is desirable that the reflective frame 14 be configured so that at least the inner surfaces of the reflective frame 14 reflect the light emitted from the LEDs 13, as mentioned above.

The light diffusion member 15 which forms a rectangular flat plate is supported by the reflective frame 14 and disposed to face the light-emitting surfaces of the LEDs 13, and a lower surface of the light diffusion member 15 is fixed to the upper end surface of the reflective frame 14.

Consequently, the backlight system 11 according to the illustrated embodiment has a box-like shape formed by the printed board 12, the reflective frame 14 and the light diffusion member 15, and a plurality of LEDs 13 are disposed in the box-like shape.

The light diffusion member 15 diffuses light emitted from the LEDs 13, and the diffused light is uniformly emitted to the liquid crystal display 17 which is disposed to face the backlight system 11. The light diffusion member 15 is formed by, for example, a transparent acrylic plate or polycarbonate plate having minute concave and convex portions or prisms provided throughout the entire surface thereof.

Next, operation of the backlight system 11 having the above-mentioned structure is explained.

When most of the light emitted from the light-emitting surfaces of the LEDs 13 enters the light diffusion member 15, the light is diffused and the light diffused through the light diffusion member 15 illuminates the liquid crystal display 17. However, there is a proportion of light reflected toward the printed board 12. The light reflected toward the printed board 12 is reflected upwardly on the reflection surface 21 on the cover member 18 mounted on the upper surface of the printed board 12. In this case, because the reflection surface 21 of the cover member 18 is provided throughout the entire upper surface of the printed board 12 excepting the mounting positions of the LEDs 13, it is possible, because of the cover member 18, to reflect the light efficiently even at the positions of the through-holes 20.

Consequently, both the light emitted from the LEDs directly toward the light diffusion member 15 and the light reflected toward the reflection surface 21 can be finally directed to the light diffusion member 15, with high reflection efficiency on the reflection surface 21 provided on the printed board 12, and therefore the liquid crystal display 17 can be illuminated effectively by the light emitted through the light diffusion member 15.

According to the backlight system structured as mentioned above, because the plurality of through-holes are provided in the printed board, it is possible to greatly reduce the weight of the printed board. Also, the cover member having a reflection surface and covering the through-holes is provided on the printed board.

Consequently, not only can the weight of the backlight system be reduced at the same time the high reflection efficiency on the upper surface of the printed board 12 can be achieved.

Furthermore, because heat from the LEDs 13 mounted on the upper surface of the printed board 12 is partly released from the through-holes 20 to the exterior of the backlight system, an efficient heat releasing effect can be expected for this backlight system.

Although the preferred embodiments of the present invention have been described, it should be noted that the present invention is not limited to these embodiments, various modifications and changes can be made to the embodiments.

What is claimed is:

1. A backlight system comprising:
    a printed board having wiring patterns;
    a plurality of light sources mounted on a surface of the printed board and electrically connected to the wiring patterns;
    a plurality of through-holes provided in portions of the printed board except positions where the light sources are mounted; and
    a cover member including openings provided in portions corresponding to the mounting positions of the light sources,
    wherein the cover member is disposed on the surface of the printed board to cover the plurality of through-holes.

2. The backlight system according to claim 1,
    wherein the through-holes are provided on the entire surface of the printed board except positions where the light sources and the wiring patterns are electrically connected.

3. The backlight system according to claim 1,
    wherein the cover member is provided throughout on the entire surface of the printed board excepting the mounting positions of the light sources.

4. The backlight system according to claim 1,
    wherein the cover member comprises a dry film resist and a reflection surface formed on the dry film resist.

5. The backlight system according to claim 1,
    wherein the cover member comprises a plastic film and a reflection surface provided on the plastic film.

6. The backlight system according to claim 1,
    further comprising a frame member disposed to surround the light sources and a light diffusion member disposed on the frame member.

* * * * *